(12) United States Patent
Stefanoski et al.

(10) Patent No.: US 7,542,292 B2
(45) Date of Patent: Jun. 2, 2009

(54) SYSTEM FOR EFFICIENTLY COOLING A PROCESSOR

(75) Inventors: Zoran Stefanoski, Menlo Park, CA (US); Jeong H. Kim, Hayward, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 12/102,828

(22) Filed: Apr. 14, 2008

(65) Prior Publication Data
US 2008/0186677 A1   Aug. 7, 2008

Related U.S. Application Data

(63) Continuation of application No. 10/822,958, filed on Apr. 12, 2004, now Pat. No. 7,359,197.

(51) Int. Cl.
H05K 7/20 (2006.01)

(52) U.S. Cl. ............ 361/699; 361/689; 361/695; 361/697; 174/15.1; 174/16.1; 174/16.3; 165/80.3; 165/80.4; 165/104.33

(58) Field of Classification Search .............. None
See application file for complete search history.

(56) References Cited

U.S. PATENT DOCUMENTS

| | | | |
|---|---|---|---|
| 4,931,905 A | 6/1990 | Cirrito et al. |
| 5,285,347 A | 2/1994 | Fox et al. |
| 5,323,847 A | 6/1994 | Koizumi et al. |
| 5,355,942 A | 10/1994 | Conte |
| 5,365,749 A | 11/1994 | Porter |
| 5,509,468 A | 4/1996 | Lopez |
| 5,731,954 A | 3/1998 | Cheon |
| 5,880,524 A | 3/1999 | Xie |
| 5,926,371 A | 7/1999 | Dolbear |
| 6,082,443 A | 7/2000 | Yamamoto et al. |
| 6,166,907 A | 12/2000 | Chien |
| 6,170,563 B1 | 1/2001 | Hsieh |
| 6,234,240 B1 | 5/2001 | Cheon |
| 6,243,268 B1 | 6/2001 | Kang et al. |
| 6,246,581 B1 | 6/2001 | Kang et al. |
| 6,333,852 B1 | 12/2001 | Lin |
| 6,343,478 B1 | 2/2002 | Chang |

(Continued)

FOREIGN PATENT DOCUMENTS

CN   2388637 Y   4/2000

(Continued)

OTHER PUBLICATIONS

English abstract of EP 1,491,987 A2, which is a family member of DE 203 09 965 U1, Dec. 29, 2004.

(Continued)

*Primary Examiner*—Boris L Chervinsky
(74) *Attorney, Agent, or Firm*—Patterson & Sheridan LLP

(57) ABSTRACT

One embodiment of a system for efficiently cooling a processor includes an active hybrid heat transport module adapted to be integrated with a fansink. The hybrid heat transport module comprises both a fluid channel and an air channel adapted for transporting heat. The hybrid heat transport module and the fansink may be used alone or in combination to dissipate heat from the processor.

14 Claims, 6 Drawing Sheets

U.S. PATENT DOCUMENTS

| | | | |
|---|---|---|---|
| 6,442,024 B1 | 8/2002 | Shih | |
| 6,452,797 B1 | 9/2002 | Konstad | |
| 6,550,531 B1 | 4/2003 | Searls et al. | |
| 6,587,343 B2 | 7/2003 | Novotny et al. | |
| 6,650,544 B1 | 11/2003 | Lai | |
| 6,671,177 B1 | 12/2003 | Han | |
| 6,705,089 B2 * | 3/2004 | Chu et al. | 62/3.2 |
| 6,717,811 B2 * | 4/2004 | Lo et al. | 361/698 |
| 6,725,910 B2 | 4/2004 | Ishida et al. | |
| 6,749,012 B2 | 6/2004 | Gwin et al. | |
| 6,760,222 B1 | 7/2004 | Wang | |
| 6,778,394 B2 | 8/2004 | Oikawa et al. | |
| 6,926,070 B2 | 8/2005 | Jenkins et al. | |
| 6,958,910 B2 | 10/2005 | Tanaka et al. | |
| 6,970,355 B2 * | 11/2005 | Ellsworth et al. | 361/694 |
| 7,002,797 B1 | 2/2006 | Wittig | |
| 7,012,807 B2 | 3/2006 | Chu et al. | |
| 7,032,652 B2 | 4/2006 | Wang et al. | |
| 7,050,299 B2 | 5/2006 | Kondo et al. | |
| 7,142,424 B2 | 11/2006 | Malone et al. | |
| 7,145,774 B2 | 12/2006 | Campini et al. | |
| 7,151,667 B2 | 12/2006 | Walters et al. | |
| 7,203,063 B2 * | 4/2007 | Bash et al. | 361/699 |
| 7,261,142 B2 | 8/2007 | Kawahara et al. | |
| 7,265,977 B2 | 9/2007 | Martin et al. | |
| 7,278,470 B2 | 10/2007 | Xia et al. | |
| 2003/0128514 A1 | 7/2003 | Inoue | |
| 2005/0226745 A1 | 10/2005 | Seko et al. | |
| 2005/0243516 A1 | 11/2005 | Stefanoski et al. | |
| 2005/0244291 A1 | 11/2005 | Tomioka et al. | |

FOREIGN PATENT DOCUMENTS

| | | |
|---|---|---|
| DE | 20212754 | 11/2002 |
| DE | 20309965 | 9/2003 |
| EP | 0 542 478 A1 | 5/1993 |
| WO | WO 02/102124 | 12/2002 |

OTHER PUBLICATIONS

EPO Examination Report citing DE 203 09 965 U1, dated Jul. 14, 2008 (Provided as explanation of relevance of Reference Citation No. B3).

PCT Search Report citing DE 202 12 754 U1, dated Aug. 4, 2005 (Provided as explanation of relevance of Reference Citation No. B1).

Scott D. Garner, PE., Thermacore Inc, "Heat Pipes for Electronics Cooling Applications" Electrics Cooling, Sep. 1996 pp. 1-10.

* cited by examiner

SYSTEM FOR EFFICIENTLY COOLING A PROCESSOR

CROSS-REFERENCE TO RELATED APPLICATIONS

This application is a continuation of U.S. patent application Ser. No. 10/822,958, filed Apr. 12, 2004 now U.S. Pat. No. 7,359,197.

BACKGROUND OF THE INVENTION

1. Field of the Invention

This invention relates generally to computer hardware and more particularly to a system for efficiently cooling a processor.

2. Description of the Background Art

FIG. 1 is an isometric view illustrating a prior art system 100 used to cool a processor (not shown). As shown, system 100 characteristically includes a heat sink assembly 104, which further includes a fan 106, walls 109 and a bottom plate 111. Typically, system 100 is thermally coupled to a processor, for example using thermal adhesive having thermal properties that facilitate transferring heat generated by the processor to bottom plate 111 of heat sink assembly 104. System 100 may also include a heat sink lid (not shown), which, among other things, prevents particles and other contaminants from entering fan 106 and air blown from fan 106 from escaping system 100. Heat sink lid 102, together with walls 109 and bottom plate 111 of heat sink assembly 104, define a plurality of air channels 108.

Fan 106 is configured to force air through air channels 108 such that the heat generated by the processor transfers to the air as the air passes over bottom plate 111. The heated air then exits heat sink assembly 104, as depicted by flow lines 114, thereby dissipating the heat generated by the processor into the external environment. This process cools the processor and, among other things, prevents the processor from burning up during operation. Persons skilled in the art will understand that air channels 108 typically are configured to direct air blown from fan 106, over bottom plate 111, to the external environment in a manner that most efficiently removes heat from the processor.

One drawback of using system 100 to cool a processor is that a sound wave produced when fan 106 forces air through an air channel 108 oftentimes establishes a standing wave within air channel 108. As persons skilled in the art will understand, this phenomenon substantially increases the noise level of the airflow through air channel 108 because the resulting standing wave produced by the interference between an incident sound wave and a reflected sound wave has an amplitude at the antinodes that is substantially greater than the amplitude of incident sound wave. The increased noise is particularly annoying to persons who use computers and other electronic devices that include a system similar to system 100.

One method for reducing airflow noise while cooling a processor is to implement a fluid-based cooling system, in which heat generated by the processor transfers to a heat transfer fluid (such as water) being quickly circulated close to the processor. However, typical fluid cooling systems are driven by large pumps, which are prone to frequent failure and tend to consume a great deal of power. Moreover, such systems tend to use large quantities of fluid, circulating at a high flow rate, and therefore must be frequently replenished or replaced.

Thus, there is a need in the art for a system for efficiently cooling a processor.

SUMMARY OF THE INVENTION

One embodiment of a system for efficiently cooling a processor includes an active hybrid heat transport module adapted to be integrated with a fansink. The hybrid heat transport module comprises both a fluid channel and an air channel adapted for transporting heat. The hybrid heat transport module and the fansink may be used alone or in combination to dissipate heat from the processor.

One advantage of the disclosed system is that, among other things, the system produces less airflow noise during operation.

A second advantage of the disclosed system is that it is more reliable than conventional fluid cooling systems.

A third advantage of the disclosed system is that it dissipates heat more effectively and more efficiently than conventional fan- or fluid-based cooling systems

DETAILED DESCRIPTION OF THE INVENTION

Figure 2:
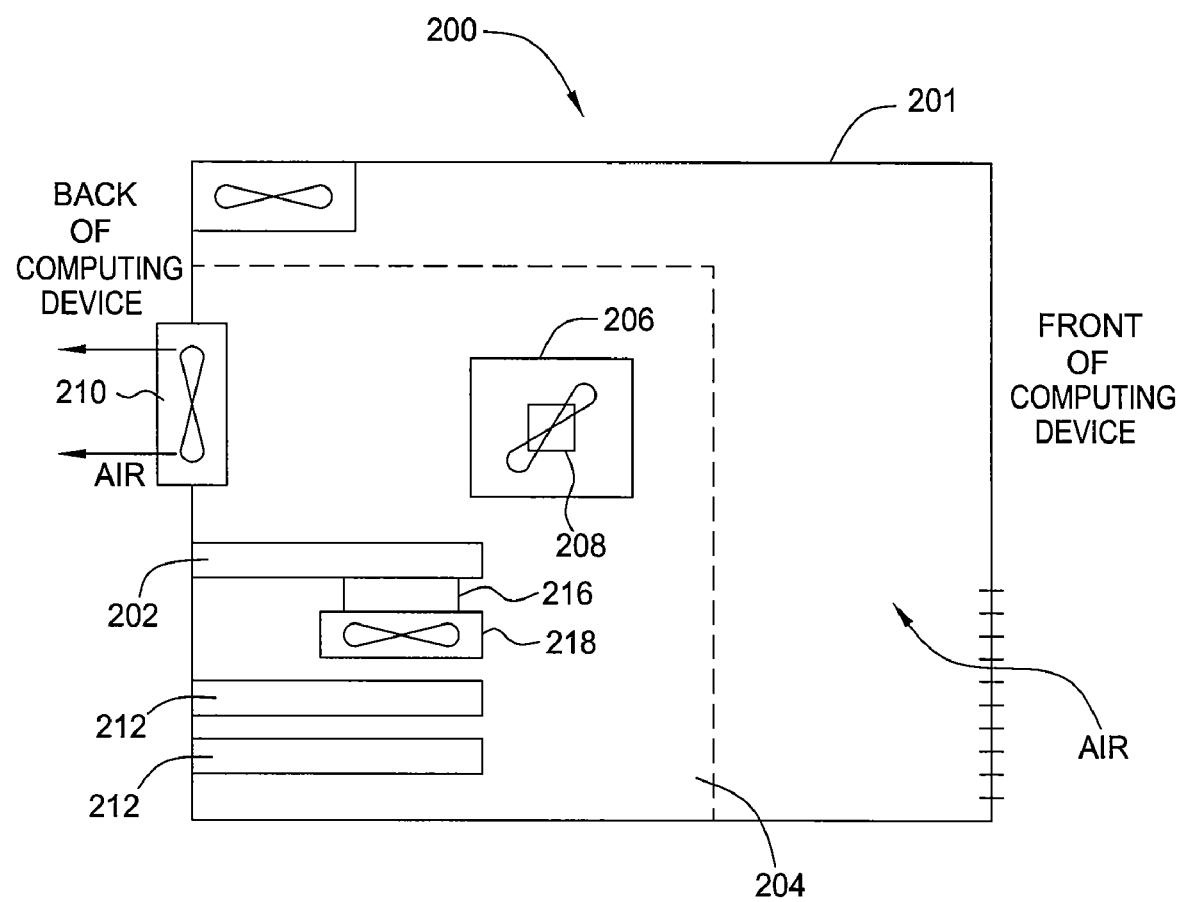
FIG. 2 is schematic diagram illustrating a computing device adapted for use with a system for cooling a processor, according to one embodiment of the present invention.

FIG. 2 is schematic diagram illustrating a computing device 200 adapted for use with a system 218 for cooling a processor, according to one embodiment of the present invention. Computing device 200 may be any type of computing device, including, without limitation, a desktop computer, a server, a laptop computer, a palm-sized computer, a personal digital assistant (PDA), a tablet computer, a gaming console, a cellular telephone, a computer-based simulator and the like.

As shown, computing device 200 includes a housing 201, within which a motherboard 204 resides. Mounted on motherboard 204 are a central processing unit (CPU) 206, a processor cooler 208 for cooling CPU 206, a system fan 210 for removing heat from computing device 200, and one or more peripheral component interface (PCI) cards 212, each interfaced with a slot located in the back part of housing 201. Motherboard 204 further incorporates a graphics card 202 that enables computing device 200 to rapidly process graphics related data for graphics intensive application, such as gaming applications. Graphics card 202 comprises a printed circuit board (PCB) upon which a plurality of circuit components (not shown), such as memory chips and the like, are mounted. In addition, graphics card 200 includes a graphics processing unit (GPU) 216, mounted to one face of graphics card 202, for processing graphics related data. Generally, cooling system 218 is configured for coupling to GPU 216 in lieu of a conventional cooling system, such as cooling system 100 of FIG. 1.

Figure 3:
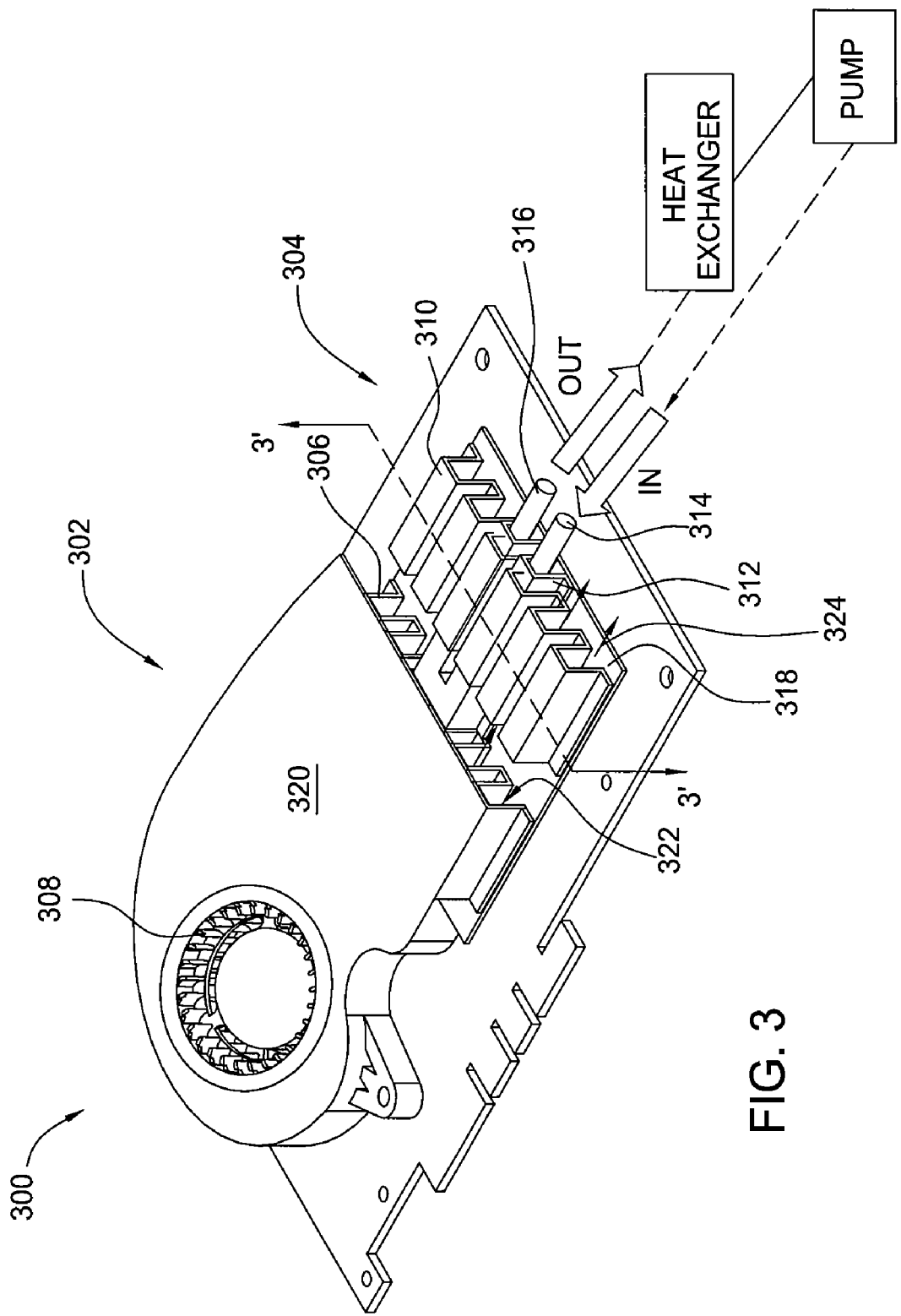
FIG. 3 is an isometric view illustrating an improved system for cooling a processor, according to one embodiment of the present invention.

FIG. 3 is an isometric view illustrating an improved system 300 for cooling a processor, according to one embodiment of the present invention. Similar to system 218 of FIG. 2, cooling system 300 may be adapted for use in any type of appropriate computing device. As shown, cooling system 300 may include, without limitation, a fanksink 302 and a hybrid heat transport module 304. As described in further detail below, fansink 302 and hybrid heat transport module 304 may operate independently or in combination to dissipate heat from a processor.

Figure 1:
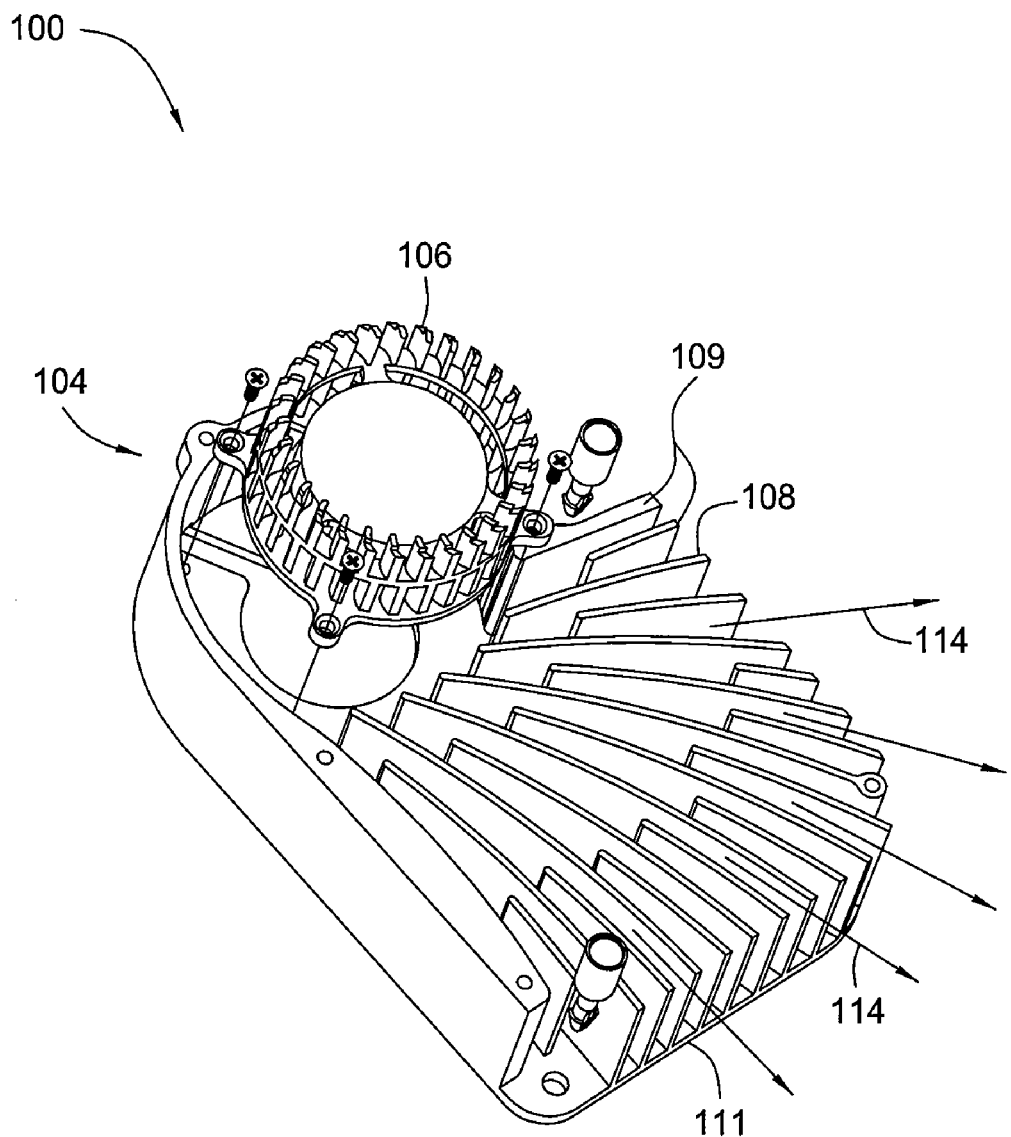
FIG. 1 is an isometric view illustrating a prior art system used to cool a processor.

In one embodiment, fansink 302 is configured in a manner similar to cooling system 100 of FIG. 1 and includes, without limitation, a fan 308, walls 306 and a bottom plate 318. In one embodiment, system 100 also includes a heat sink lid 320, which, among other things, prevents particles and other contaminants from entering fan 308 and air blown from fan 308 from escaping system 300. Heat sink lid 320, together with walls 306 and bottom plate 318 of fansink 302, define a plurality of air channels 322.

Hybrid heat transport module 304 is adapted to be integrated with fansink 302. In one embodiment, hybrid heat transport module 304 is thermally coupled to a portion of bottom plate 318 and includes, without limitation, a fluid channel 312, an inlet 314, an outlet 316 and a plurality of air channels 310. Hybrid heat transport module 304 is coupled to a pump, which is adapted for circulating a heat transfer fluid (e.g., water or any other suitable heat conducting fluid) through a closed loop, including fluid channel 312. In one embodiment, the pump circulates fluid from hybrid heat transport module 304 through a heat exchanger prior to supplying the fluid back to hybrid heat transport module 304. Inlet 314 and outlet 316 are configured for respectively supplying and removing the heat transfer fluid to fluid channel 312.

In one embodiment, air channels 310 are adapted for coupling to air channels 322 and for transporting forced air from fan 308. In one embodiment, air channels 310 are positioned over and around fluid channel 312, so that fluid channel 312 is substantially enclosed within air channels 310. In alternative embodiment, fluid channel 312 and air channels 310 may be positioned in any relative orientation that provides good heat dissipation. Those skilled in the art will recognize that hybrid heat transport module 304 may be implemented to transfer heat via air channels 310, fluid channel 312, or both in combination.

In one embodiment, fansink 302 dissipates heat in a manner similar to system 100 illustrated in FIG. 1. Fan 308 is configured to force air through air channels 322 and air channels 310 such that the heat generated by the processor transfers to the air as the air passes over bottom plate 318. The heated air then exits system 300, as depicted by flow lines 324, thereby dissipating the heat generated by the processor into the external environment.

In one embodiment, the pump circulates the heat transfer fluid through fluid channel 312 of hybrid heat transport module 304, and heat generated by the processor transfers to the circulating heat transfer fluid as well as to air in air channels 310. Fluid channel 312 is adapted for transporting heat transfer fluid through a downstream heat exchanger, which dissipates heat from the heat transfer fluid into an outside environment.

Persons skilled in the art will recognize that system 300, including fansink 302 and hybrid heat transport module 304, may be used to cool any type of processor. For example, in one embodiment, the processor comprises a graphics processing unit. In an alternative embodiment, the processor may comprise a central processing unit. In yet another alternative embodiment, the processor may comprise an application-specific integrated circuit (ASIC). In another embodiment, system 300 may be sized to cool a memory chip in addition to the processor.

Figure 4:
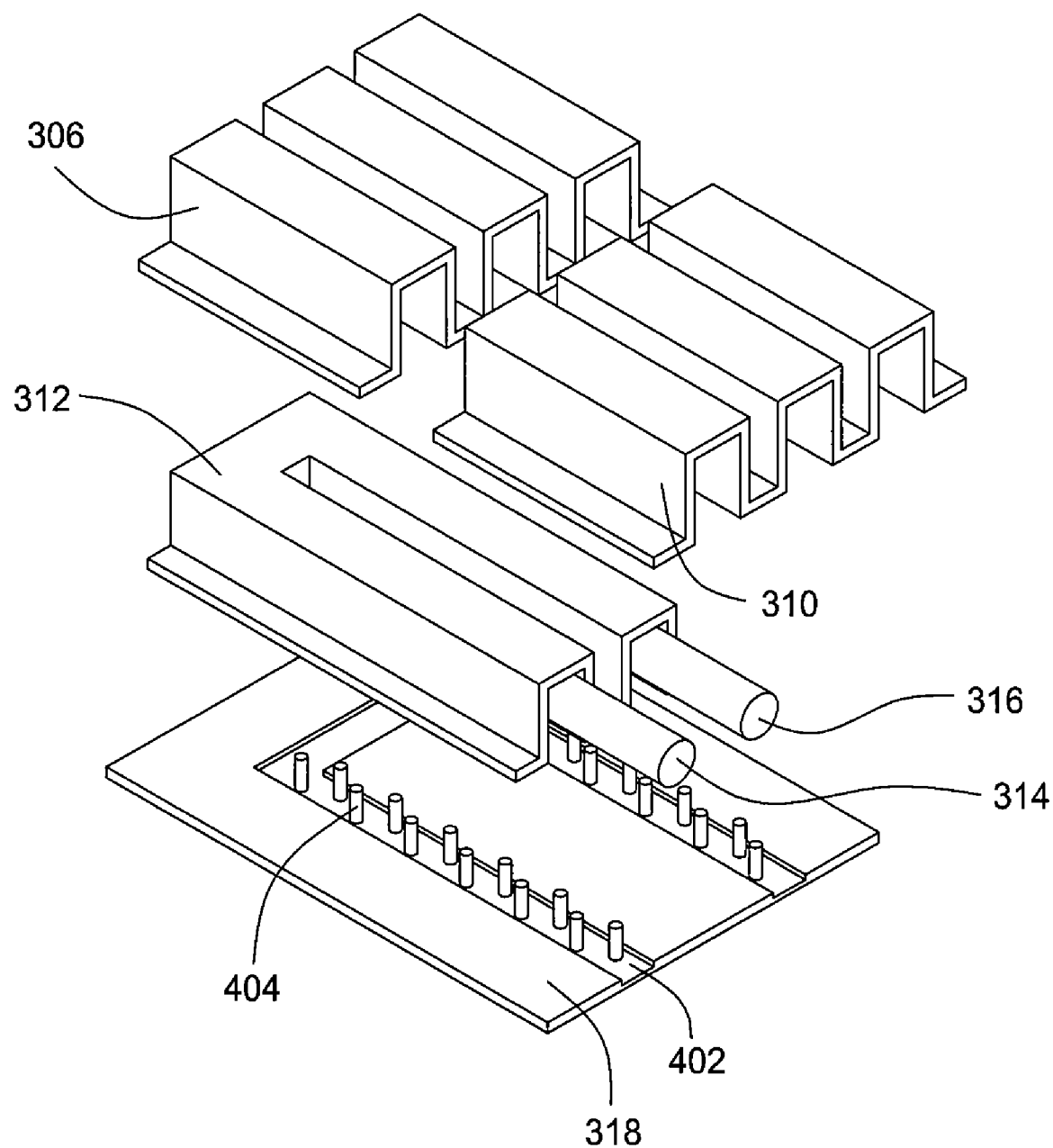
FIG. 4 is an exploded view of a portion of the cooling system illustrated in FIG. 3.

FIG. 4 is an exploded view of a portion of cooling system 300. In one embodiment, bottom plate 318 includes a trench 402 sized for coupling to and sealing fluid channels 312. In one embodiment, the surface of trench 402 is textured to increase the heat transfer surface area of bottom plate 318, as described in further detail below, and to transfer heat from bottom plate 318 to the heat transfer fluid flowing through fluid channel 312. For example, trench 402 may further include a plurality of pins 404 extending upward from bottom plate 318. The density and geometric shape of pins 404 may vary, so long as pins 404 are capable of effectively transferring heat from bottom plate 318 to the heat transfer fluid flowing around pins 404.

Figure 5:
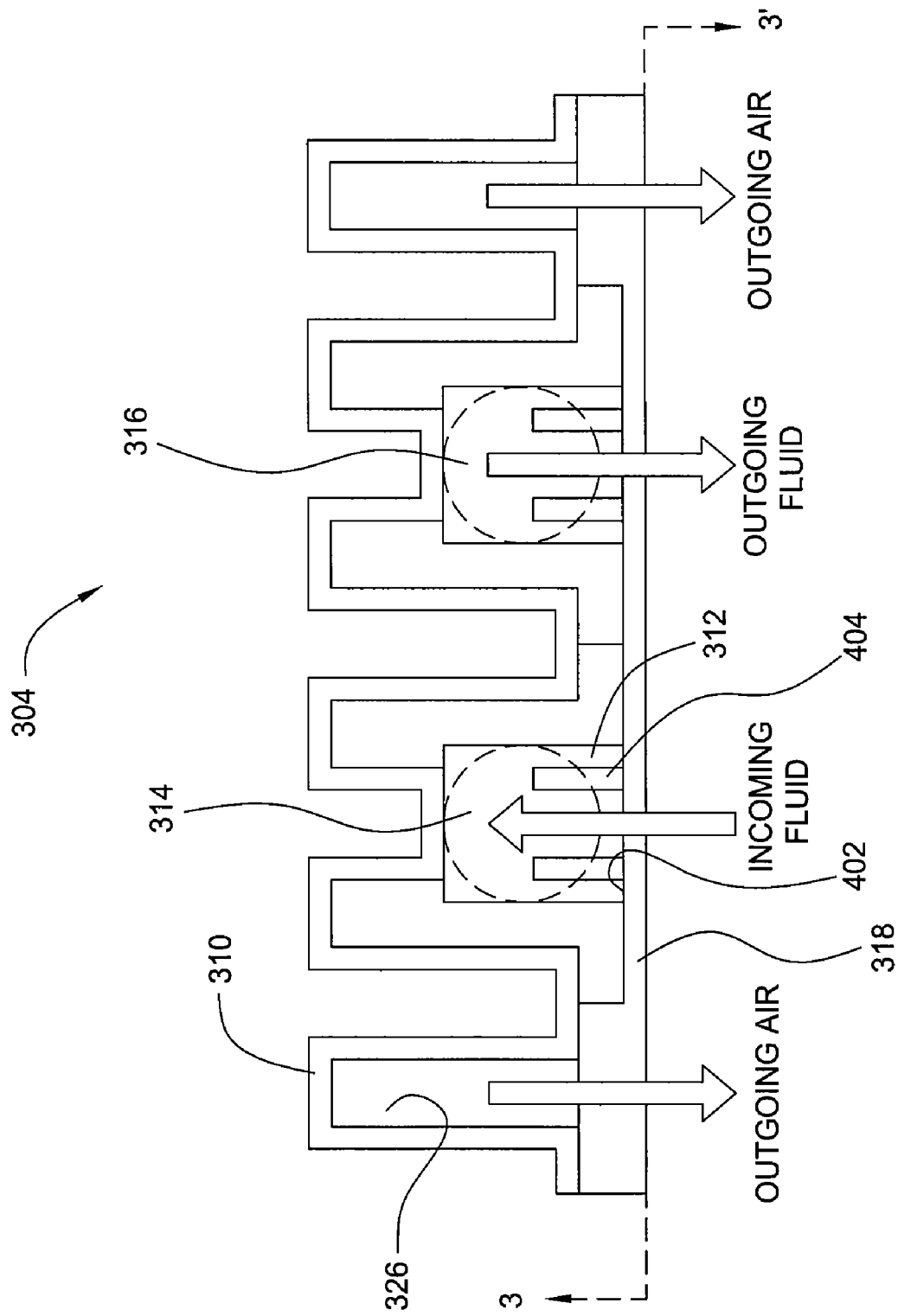
FIG. 5 is a cross sectional view of a portion of the cooling system illustrated in FIG. 3.

FIG. 5 is a cross sectional view of hybrid heat transport module 304, taken along sectional line 3-3' of FIG. 3. As illustrated, hybrid heat transport module 304 is configured to dissipate heat from a processor via fluid channel 312 and/or air channels 310. As described above, air channels 310 may be configured to interface to air channels 322 of fansink 302, so that even when the pump is not activated to circulate fluid through fluid channel 312, air channels 310 will operate to increase the heat transfer surface area of system 300 (e.g., by effectively extending air channels 322), thereby enabling heat to be dissipated more efficiently.

Fansink 302 and hybrid heat transport module 304 may be implemented independently or in combination to dissipate heat from a processor, in order to dissipate heat from the processor in the most efficient manner. For example, fansink 302 may be implemented to dissipate a majority of the generated heat, hybrid fluid heat transport module 304 may be implemented to dissipate a smaller quantity of heat, and the proportions of heat dissipated by fansink 302 and hybrid heat transport module 304 may be dynamically adjusted. Alternatively, one of fansink 302 and hybrid heat transport module 304 may be implemented as a primary means for heat dissipation, while the other mechanism is implemented on an as-needed basis to dissipate excess heat.

Figure 6:
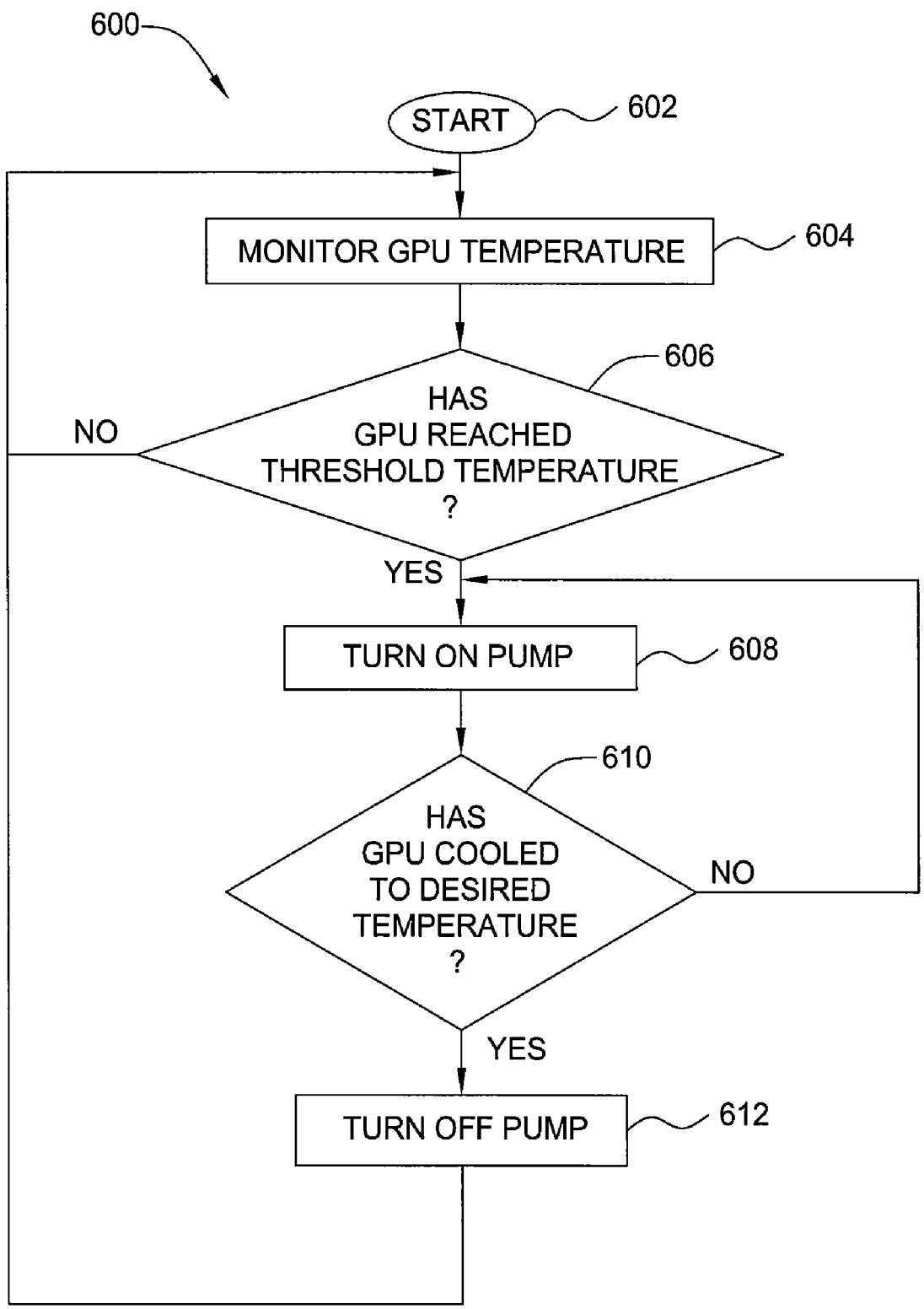
FIG. 6 is a flow diagram illustrating a method for controlling the cooling system illustrated in FIG. 3, according to one embodiment of the invention.

FIG. 6 is a flow diagram illustrating a method 600 for controlling cooling system 300, for example for implementation by a control unit coupled to cooling system 300, according to one embodiment of the invention. In the illustrated embodiment, the method 600 implements fansink 302 as a primary means for heat dissipation, while hybrid heat transport module 304 is implemented on as as-needed basis. Method 600 is initialized at step 602 and proceeds to step 604, where method 600 monitors the temperature of the processor, for example by means of a thermal diode or other sensor positioned proximate to the processor. Method 600 then proceeds to step 606 and determines whether the temperature of the processor has reached a predetermined threshold temperature at which a secondary heat dissipation mechanism (e.g., hybrid heat transport module 304) should be implemented.

If method 600 determines at step 606 that the processor temperature has not reached the threshold temperature, method 600 returns to step 604 and continues to monitor the processor temperature. Alternatively, if method 600 determines at step 606 that the threshold temperature has been reached or exceeded, method 600 proceeds to step 608 and turns on the pump of hybrid heat transport module 304, in order to engage the secondary heat dissipation mechanism. Method 600 then determines at step 610 whether the implementation of hybrid heat transport module 304 has cooled the processor to a predetermined desired temperature (e.g., an ideal operating temperature).

If method 600 determines at step 610 that the processor has been cooled to the desired temperature, method 600 proceeds to step 612 and turns off the pump of hybrid heat transport module 304, effectively shutting off hybrid heat transport module 304 so that the processor continues to be cooled by the primary heat dissipation mechanism (e.g., fansink 302). Method 600 then returns to step 604 and continues to monitor the temperature of the processor. Alternatively, if method 600 determines at step 610 that the processor has not yet been cooled to the desired temperature, method 600 returns to step 608 and continues to run the pump of hybrid heat transport module 304 until the processor is cooled to the desired temperature.

Cooling system 300 offers several advantages over conventional cooling systems, such as cooling system 100 of FIG. 1. First, using fansink 302 in conjunction with hybrid heat transport module 304 results in a more reliable cooling system, because the pump of hybrid heat transport module 304 may be implemented on a limited or as-needed basis. The life of the pump is thereby extended, because the pump is not constantly operating at maximum power. For example, in one embodiment, the life of a typical pump may be extended by approximately fifty percent. Alternatively, cooling system 300 may incorporate a pump that is significantly smaller than a pump typically incorporated in a fluid-based cooling system. Moreover, in the event of failure, fansink 302 may operate as a backup to fluid heat transport module 304, and vice versa.

Also, because hybrid heat transport module 304 may be implemented on a limited or as-needed basis (e.g., as opposed to being a primary heat dissipation means), the amount of heat transfer fluid and the flow rate of the fluid through fluid channel 312 may be reduced compared to a conventional fluid-based cooling system. Thus, cooling system 300 requires less maintenance (e.g., frequent replenishment of fluid reservoirs) than conventional fluid-based cooling systems, and the pump consumes less power.

In addition, because cooling system 300 relies less on fansink 302 to dissipate heat (e.g., when hybrid heat transport module 304 is implemented either alone or in conjunction with fansink 302), an amplitude at the antinodes of interfering sound waves established within air channel 322 is smaller. Thus, the noise level of the airflow through air channel 322 may be substantially decreased.

Moreover, using hybrid heat transport module 304 in conjunction with fansink 302 increases the heat flow rate, (dQ/dT), of cooling system 300, which enables cooling system 300 to transfer heat away from the processor more efficiently than conventional cooling systems. One reason for this increase is that the heat transfer area, A, of cooling system 300 can be substantially larger than that of conventional cooling systems, owing to the incorporation of air channels 310 and pins 404. Even if hybrid heat transport module 304 is not active (e.g., the pump is not activated), the configuration of hybrid heat transport module 304 will increase the heat transfer surface area over which air forced by fan 308 travels, as the forced air will travel through both channels 322 and channels 310.

Heat flow rate (dQ/dT) is calculated according to the following equation:

$$(dQ/dT) = hA(T_{sink} - T_{air}) \quad \text{(EQN. 1)}$$

where h is the heat transfer coefficient of cooling system 300, $T_{sink}$ is the temperature of the heat exchanging elements (e.g., air channels 322, air channels 310 and pins 404) and $T_{air}$ is the temperature of the air flowing through the heat exchanging elements. As discussed above, since A is much larger for cooling system 300 than for a conventional cooling system (and ΔT is approximately the same), the heat flow rate (dQ/dT) is substantially increased when using cooling system 300.

The increased heat flow rate (dQ/dT) further results in cooling system 300 having an improved heat transfer efficiency, $\ominus_{sa}$, relative to conventional cooling systems. As persons skilled in the art will recognize, heat transfer efficiency, $\ominus_{sa}$, may be calculated according to the following equation:

$$\ominus_{sa} = (T_{sink} - T_{air})/(dQ/dT)(° \text{C./watt}) \quad \text{(EQN. 2)}$$

where a smaller value for $\ominus_{sa}$ indicates increased efficiency and therefore is more desirable. Again, the larger heat transfer area, A, causes cooling system 300 to have greater heat flow rate (dQ/dT), and, consequently, an improved efficiency as well (as evidenced by the smaller value of $\ominus_{sa}$).

Simulations comparing improved cooling system 300 with a conventional cooling system show that improved cooling system 300 can cool a processor to temperatures that are upwards of twenty-two percent lower than temperatures achieved with the conventional cooling system, without substantially increasing power consumption.

The location of cooling system 300, fansink 302 and hybrid heat transport module 304, as well as the size and shape of the components, may be dictated by other board mounted components, as well as by accelerated graphics processor (AGP)-specified envelope constraints. Moreover, those skilled in the art will appreciate that the cooling system described herein may be implemented in both ATX motherboard configurations (wherein a graphics card is orientated so that the GPU faces downward relative to the computing device, as illustrated in FIG. 2) and BTX configurations (wherein a graphics card is orientated so that the GPU faces upward relative to the computing device). Therefore, the cooling system of the present invention may be implemented as a single-slot cooling solution, e.g., wherein the size of the cooling system does not require space on the motherboard that may be allocated to other components, such as PCI cards.

Thus, the present invention represents a significant advancement in the field of processor cooling. By implementing a hybrid heat transport module in conjunction with a fansink, a system used to cool a cooling system will produce less airflow noise in operation than systems that incorporate conventional heat sink lids and will cool a processor more effectively and efficiently. Moreover, by implementing the hybrid heat transport module on a limited basis, the life of a pump used to drive a portion of the hybrid heat transport module can be significantly extended.

Although the invention has been described above with reference to specific embodiments, persons skilled in the art will understand that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A system for cooling a processor, the system comprising:
a hybrid heat transport module configured to be thermally coupled to the processor and to a fansink adapted to use forced air to remove heat from the processor, the hybrid heat transport module including:

a plurality of air channels adapted to receive the forced air from the fansink; and a fluid channel also adapted for removing heat from the processor, wherein the plurality of air channels are positioned over and around the fluid channel such that the fluid channel is substantially enclosed within the air channels.

2. The system of claim 1, wherein the fluid channel comprises an inlet and an outlet.

3. The system of claim 2, further comprising a pump that is coupled to the inlet and the outlet of the fluid channel forming a closed loop channel.

4. The system of claim 3, wherein the pump is adapted for circulating the heat transfer fluid through the fluid channel.

5. The system of claim 4, further comprising a heat exchanger that is coupled between the outlet and the pump and configured to dissipate heat from the heat transfer fluid in the fluid channel into an outside environment.

6. The system of claim 1, wherein the hybrid heat transport module is adapted for dissipating heat from the processor through air, through a fluid, or through both air and fluid.

7. The system of claim 1, wherein the fansink comprises:

a fan configured to force air through the at least one air channel of the fansink and the plurality of air channels; and the at least one air channel that is adapted for removing heat from the processor, wherein the fansink is coupled to a bottom plate.

8. The system of claim 7, wherein the fansink and the hybrid heat transport module are adapted for simultaneous operation.

9. The system of claim 7, wherein the fansink and the hybrid heat transport module are adapted for independent operation.

10. The system of claim 1, wherein the system is sized to cool a memory chip in addition to the processor.

11. A method for cooling a processor, the method comprising the steps of:

forcing air through a plurality of air channels to continually remove heat from the processor;

monitoring a temperature of the processor; and circulating a heat transfer fluid in a fluid channel substantially enclosed within the plurality of air channels of a hybrid heat transport module that is thermally coupled to the processor to further remove heat from the processor when the processor reaches a threshold temperature.

12. The method of claim 11, further comprising the step of ceasing to circulate the heat transfer fluid through the fluid channel when the processor is cooled to a desired temperature.

13. The method of claim 11, wherein the step of circulating comprises turning on a pump that is coupled to the fluid channel to form a closed loop channel.

14. The method of claim 13, further comprising the step of transporting the heat transfer fluid through a heat exchanger that is coupled between an outlet of the fluid channel and the pump and adapted to dissipate heat from the heat transfer fluid into an outside environment.

* * * * *